(12) United States Patent
Rubin et al.

(10) Patent No.: US 10,692,768 B1
(45) Date of Patent: Jun. 23, 2020

(54) VERTICAL TRANSPORT FIELD-EFFECT TRANSISTOR ARCHITECTURE

(71) Applicant: International Business Machines Corporation, Armonk, NY (US)

(72) Inventors: Joshua M. Rubin, Albany, NY (US); Chen Zhang, Albany, NY (US); Oleg Gluschenkov, Tannersville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/285,763

(22) Filed: Feb. 26, 2019

(51) Int. Cl.
 *H01L 21/82* (2006.01)
 *H01L 21/822* (2006.01)
 *H01L 21/8238* (2006.01)
 *H01L 27/092* (2006.01)

(52) U.S. Cl.
 CPC .. *H01L 21/8221* (2013.01); *H01L 21/823807* (2013.01); *H01L 21/823814* (2013.01); *H01L 21/823864* (2013.01); *H01L 21/823885* (2013.01); *H01L 27/092* (2013.01)

(58) Field of Classification Search
 CPC ......... H01L 21/8221; H01L 21/823885; H01L 21/823864; H01L 21/823807
 See application file for complete search history.

(56) References Cited

U.S. PATENT DOCUMENTS

| | | | |
|---|---|---|---|
| 5,641,694 | A | 6/1997 | Kenney |
| 6,610,548 | B1 | 8/2003 | Ami et al. |
| 6,852,575 | B2 | 2/2005 | Bojarczuk, Jr. et al. |
| 7,135,699 | B1 | 11/2006 | Atanackovic |
| 9,202,894 | B1 | 12/2015 | Zang |
| 9,673,045 | B2 | 6/2017 | Dasgupta et al. |
| 10,032,912 | B2 | 7/2018 | Morin et al. |
| 2016/0172462 | A1 | 6/2016 | Cheng et al. |
| 2017/0047331 | A1 | 2/2017 | Chen et al. |

OTHER PUBLICATIONS

H.S.P Wong et al., Self-aligned (top and bottom) double-gate MOSFET with a 25 nm thick silicon channel, International electron Devices Meeting, 1997, pp. 427-430.
Vahedi, Shid, Etch Challenges & Solutions for 3D NAND, SEMICON China, 2016, 15 slides.

*Primary Examiner* — Douglas M Menz
(74) *Attorney, Agent, or Firm* — Vazken Alexanian; Otterstedt, Wallace & Kammer, LLP

(57) ABSTRACT

A vertical transport field-effect transistor architecture is fabricated using a fin-last fabrication technique that enables pre-patterning of sacrificial gate layers and/or sacrificial source/drain layers with substantially flat topography prior to fin formation. Fins are epitaxially grown in trenches extending vertically through the device layers. Discrete regions of the sacrificial layers are later removed and replaced with appropriate source/drain and/or gate materials. Dielectric spacer elements are used to constrain feature dimensions of the replacement materials.

20 Claims, 10 Drawing Sheets

VERTICAL TRANSPORT FIELD-EFFECT TRANSISTOR ARCHITECTURE

BACKGROUND

The present invention relates generally to the electrical, electronic and computer arts and, more particularly, to vertical transistor structures and their fabrication.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (cell gate pitch) versus comparable logic circuits comprising lateral FET layouts. Minimum wiring pitch can also be relevant for realizing denser vertical FET layouts.

BRIEF SUMMARY

A monolithic semiconductor structure including stacked vertical transport FET architectures and fabrication of such a structure are aspects of inventions disclosed herein.

In one aspect, an exemplary method of fabricating a stacked vertical transport field-effect transistor structure includes forming a bottom vertical transport field-effect transistor architecture including a first sacrificial gate layer and a plurality of dielectric gate spacer elements extending vertically within the first sacrificial gate layer. An electrically insulating spacer is formed layer over the bottom vertical transport field-effect transistor architecture. A top vertical transport field-effect transistor architecture is formed over the electrically insulating spacer layer. The top vertical transport field-effect transistor architecture includes a second sacrificial gate layer and a plurality of dielectric gate spacer elements extending vertically within the second sacrificial gate layer. The method further includes forming a vertical trench through the top vertical transport field-effect transistor architecture, the electrically insulating spacer layer and the bottom vertical transport field-effect transistor architecture down to a semiconductor substrate layer and epitaxially growing a bottom fin portion of a semiconductor fin on the semiconductor substrate layer and within the vertical trench. The bottom fin portion extends through the bottom vertical transport field-effect transistor architecture and within the gate spacer elements in the first sacrificial gate layer. A partition layer is epitaxially grown within the vertical trench and over the bottom fin portion. A top fin portion of the semiconductor fin is epitaxially grown on the partition layer and within the vertical trench. The top fin portion extends through the top vertical transport field-effect transistor architecture and within the gate spacer elements in the second sacrificial gate layer.

A further method relates to the fabrication a vertical transport field-effect transistor structure. The method includes forming a vertical transport field-effect transistor architecture including a bottom source/drain region, a sacrificial gate layer above the bottom source/drain region, a bottom dielectric spacer between the bottom source/drain region and the sacrificial gate layer, a top dielectric spacer above the sacrificial gate layer, and a plurality of dielectric gate spacer elements extending vertically within the sacrificial gate layer and between the bottom and top dielectric spacers. A vertical trench is formed through the vertical transport field-effect transistor architecture and a semiconductor fin is epitaxially grown within the vertical trench. The semiconductor fin includes a channel region extending through the sacrificial gate layer. A portion of the sacrificial gate layer is replaced with gate dielectric material and metal gate material bounded by the gate spacer elements. A VTFET architecture obtained thereby forms a further aspect of the invention.

In a further aspect, stacked, vertical transport field-effect transistor structure includes a bottom vertical transport field-effect transistor structure including a first gate layer, a bottom source/drain layer including a doped semiconductor substrate layer and a top source/drain layer. A bottom horizontal spacer is between the doped semiconductor substrate layer and the first gate layer and a top horizontal spacer is between the first gate layer and the top source/drain layer. A plurality of dielectric gate spacer elements are within the first gate layer and extend between the bottom horizontal spacer and the top horizontal spacer. The stacked VTFET structure further includes a top vertical transport field-effect transistor structure above the bottom vertical transport field-effect transistor structure. The top vertical transport field-effect structure includes a second gate layer, a bottom source/drain layer, a top source/drain layer, a bottom horizontal spacer between the bottom source/drain layer and the second gate layer, a top horizontal spacer between the second gate layer and the top source/drain layer, and a plurality of dielectric gate spacer elements within the second gate layer. The dielectric gate spacer elements extend between the bottom horizontal spacer and the top horizontal spacer. A horizontal, electrically insulating spacer layer is between the bottom vertical transport field-effect transistor structure and the top vertical transport field-effect transistor structure. A vertical trench extends through the top vertical transport field-effect transistor structure, the electrically insulating spacer layer, and the bottom vertical transport field-effect transistor structure down to the doped semiconductor substrate layer. A semiconductor fin on the doped semiconductor substrate layer and within the vertical trench includes a top fin portion extending within the top vertical transport field-effect transistor structure and a bottom fin portion extending within the bottom vertical transport field-effect transistor structure. An electrically insulating partition layer is within the vertical trench and electrically isolates the top fin portion and the bottom fin portion. At least one of the first and second gate layers comprises gate dielectric material and metal gate material bounded by a first set of the gate spacer elements.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;

Substantial area scaling;

Eliminating need for patterned small features between high aspect ratio fins in deep trenches;

Pre-patterning of source, drain and gate regions prior to trench epitaxy.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 12CC is a schematic, cross-sectional view showing an alternative embodiment following channel recessing and deposition of gate materials;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
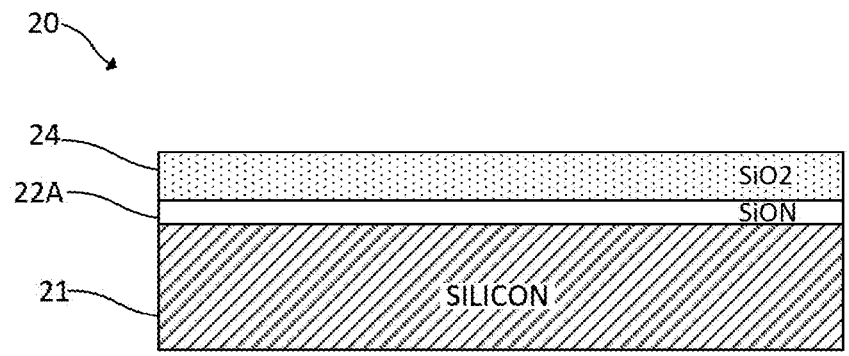
FIG. 1 is a schematic, cross-sectional illustration of a semiconductor substrate including a bottom spacer layer and a layer of sacrificial gate material.

An initial structure 20 including a semiconductor substrate 21 is shown in FIG. 1. The substrate may originally be in the form of a bulk silicon wafer that is essentially undoped or lightly doped. Alternatively, a substantially monocrystalline semiconductor layer, which can be referred to as an SOI layer, of a semiconductor-on-insulator substrate can be employed. Doping of the substrate 21 is sufficient to enable its later use as a bottom source/drain region of a vertical transport field-effect transistor (VTFET). In an exemplary embodiment, the substrate 21 is doped with an n-type dopant such as phosphorus or arsenic that provides n-type conductivity. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. The dopant implanted in the substrate 21 may, for example, be phosphorus in a concentration in the range of $1\text{-}5\times10^{21}CM^{-3}$ or 2-10 atomic % of phosphorus in Si. Various techniques can be employed to incorporate dopants in semiconductors, including implantation and diffusion.

A bottom spacer layer 22A such as silicon oxynitride (SiON) or other suitable electrically insulating layer is deposited on the top surface of the substrate 21 using, for example, plasma-enhanced chemical vapor deposition (PECVD). Shallow trench isolation regions (not shown) may be formed within the substrate 21 prior to such deposition. The bottom spacer layer 22A may have a thickness of about five to about ten nanometers, though such a range is not considered critical. The bottom spacer layer can be deposited directly as a blanket film on the top surface of the doped substrate (source/drain layer) 21 using directional deposition techniques including, but not necessarily limited to high density plasma (HDP) deposition and gas cluster ion beam (GCM) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Both the substrate 21 and dielectric bottom spacer 22A are horizontal structures including horizontal, planar top surfaces in the exemplary embodiment. The dielectric bottom spacer layer comprises multiple layers in some embodiments.

A first sacrificial gate layer 24 is conformally deposited on the bottom spacer layer 22A. The material chosen for the first sacrificial gate layer 24, such as undoped silicon dioxide, can be etched selectively with respect to the bottom spacer layer 22A (and subsequently formed top spacer layer) as described below. In one or more embodiments, plasma enhanced chemical vapor deposition is used to deposit the undoped oxide layer forming the first sacrificial gate layer.

The bottom sacrificial gate layer 24 is patterned to form trenches 28 therein. The trenches extend down to the bottom spacer layer 22A. A patterned mask (not shown) may be formed on the top surface of the bottom sacrificial gate layer. The mask has openings corresponding to the portions of the bottom sacrificial gate layer to be removed. A reactive ion etch may be employed to remove the selected portions of the sacrificial material. An oxide layer can, for example, be selectively and directionally etched using $CHF_3$/Ar plasma reactive ion etch. Each remaining portion of the sacrificial gate layer includes a vertical sidewall extending from the bottom spacer layer 22A, as schematically illustrated in FIG. 2.

Figure 2:
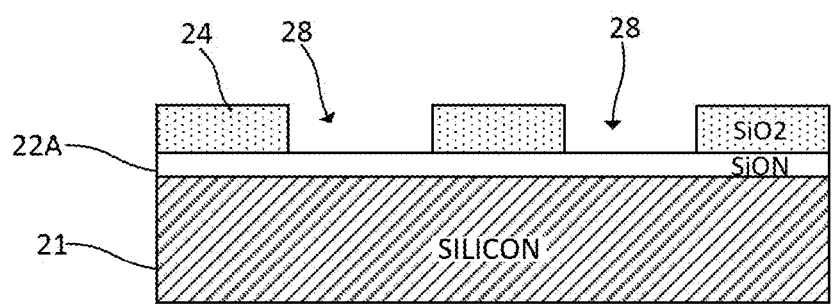
FIG. 2 is a schematic, cross-sectional view of the structure shown in FIG. 1 following patterning of the sacrificial gate material.
Figure 3:
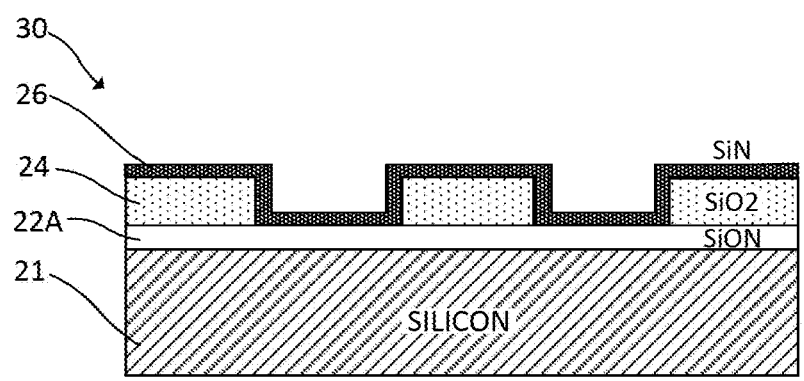
FIG. 3 is a schematic, cross-sectional view showing the structure of FIG. 2 following deposition of an etch stop layer on the sacrificial gate material.
Figure 4A:
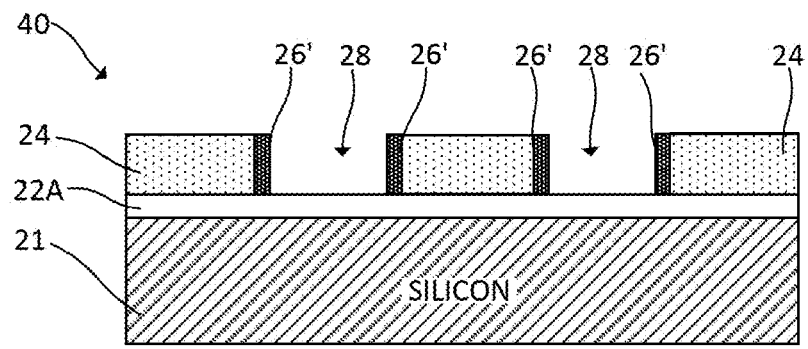
FIG. 4A is a schematic, cross-sectional view showing the structure of FIG. 3 following formation of spacers from the etch stop layer.
Figure 4B:
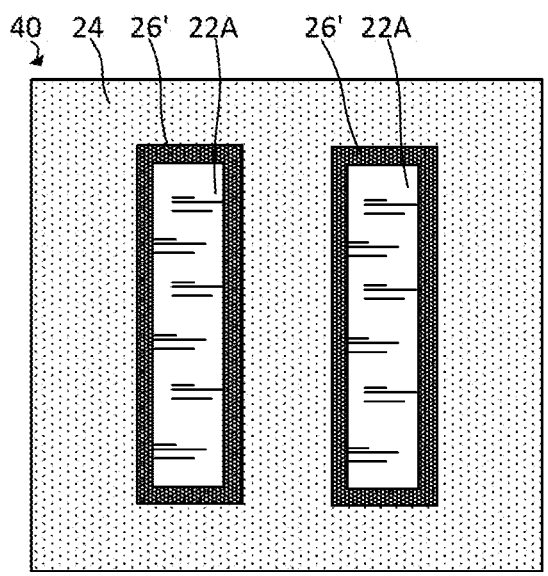
FIG. 4B is a top plan view thereof.

Electrically insulating vertical spacers can be formed by any method known in the art, including depositing a conformal layer 26 over the structure shown in FIG. 2 and removing unwanted material using an anisotropic etching process such as reactive ion etching (RIE) or plasma etching. In an exemplary embodiment, a silicon nitride layer is deposited. A silicon nitride layer can be deposited via CVD, PECVD, sputtering, or other suitable techniques. The silicon nitride layer can have a thickness in the range of one to five nanometers (1-5 nm), though this range is not considered critical. A structure 30 as schematically illustrated in FIG. 3 may be initially obtained. The structure 40 following spacer RIE includes trenches 28 between sacrificial gate portions and extending down to the bottom spacer layer 22A and gate layer spacers 26' on each of the sidewalls of the bottom sacrificial gate layer 24. FIGS. 4A and 4B provide cross-sectional and top plan views of an exemplary structure following vertical spacer formation. As best shown in FIG. 4B, the gate layer spacers 26' may include connected spacer elements or segments that form rectangular configurations.

Figure 5:
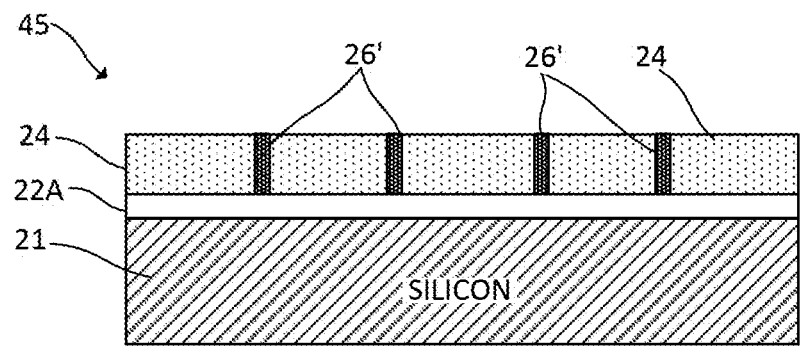
FIG. 5 is a schematic, cross-sectional view showing the structure of FIG. 4A following further deposition of sacrificial gate material and planarization.

The trenches 28 formed by patterning the bottom sacrificial gate layer 24 are filled with sacrificial gate material such as silicon dioxide. The structure is then planarized down to the top surfaces of the gate layer spacers 26'. A CMP polish stop layer (not shown) may be incorporated in the deposited oxide material to enable gate length control for the VTFET to be formed later in the process. The CMP polish stop layer can be incorporated at the top of the sacrificial gate layer 24 prior to trench formation. A structure 45 as shown in FIG. 5 may be obtained.

Figure 6:
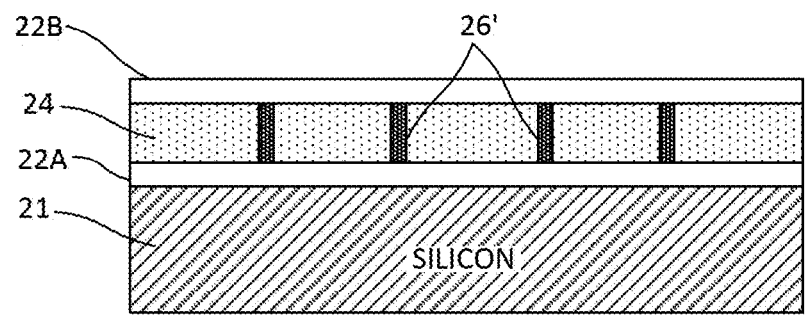
FIG. 6 is a schematic, cross-sectional view showing the structure of FIG. 5 following deposition of a spacer layer over the sacrificial gate material.

A top horizontal spacer layer 22B, which may comprise multiple layers, is deposited on the planarized sacrificial gate layer 24 and the exposed top surfaces of the gate layer spacers 26'. As shown in FIG. 6, discrete portions of the sacrificial gate material are confined between the bottom and top spacer layers 22A, 22B as well as between segments of the gate layer spacers 26'. The gate layer spacer segments later function as etch stops when a selected portion of the sacrificial gate material is removed (due to, for example, the etch selectivity of SiN spacer material over $SiO_2$ sacrificial gate material).

Figure 7:
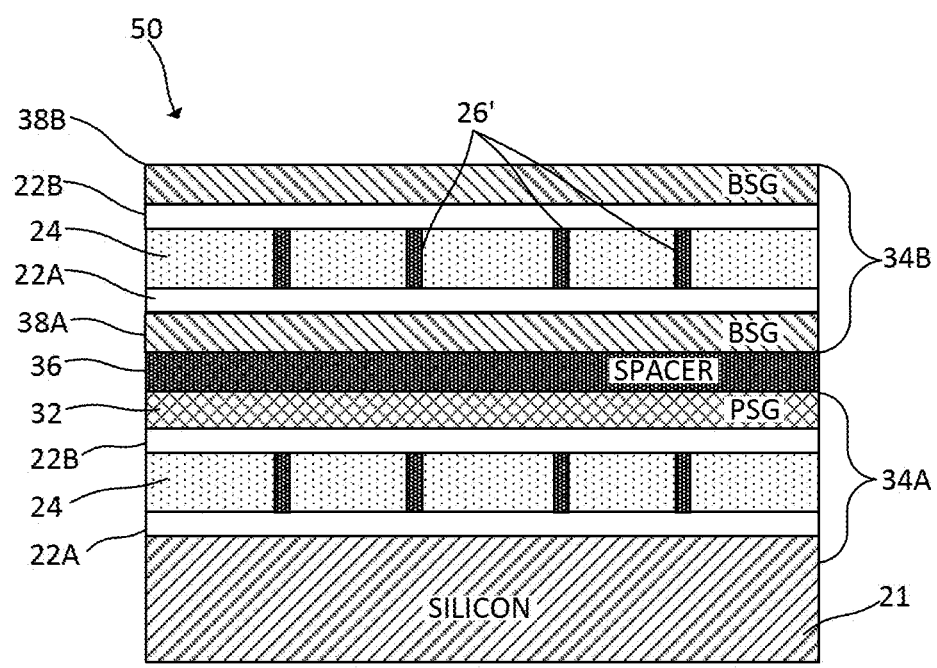
FIG. 7 is a schematic, cross-sectional view showing the structure of FIG. 6 following deposition of a stack of layers thereon, including sacrificial source/drain layers, a further layer of sacrificial gate material, and further spacer layers.

A sacrificial top source/drain layer 32 is deposited on the top spacer layer 22B. Phosphosilicate glass (PSG) and arsenosilicate glass (ASG) are exemplary silicate materials that may be deposited as a sacrificial source/drain layer in one or more embodiments. The thickness of the layer 32 may be between fifteen and twenty-five nanometers (15-25 nm). In one exemplary embodiment, the layer 32 has a thickness of about twenty nanometers. Other sacrificial materials that can be removed selectively with respect to surrounding layers can alternatively be employed. A bottom VTFET architecture 34A is comprised of the doped bottom source/drain region (substrate 21), horizontally extending bottom and top spacer layers 22A, 22B, a sacrificial gate layer 24 between the bottom and top spacer layers, and the sacrificial top source/drain layer 32, as shown in FIG. 7. The sacrificial gate layer 24 may have a thickness of about fifteen nanometers. The bottom VTFET architecture 34A is an nFET architecture in some embodiments used to form an nFET device. In some exemplary embodiments, a sacrificial PSG or ASG source/drain layer is later used for doping trench epitaxy in the source/drain regions.

An electrically insulating spacer layer 36 is formed over the bottom VTFET architecture 34A. The horizontal spacer layer 36 electrically isolates the bottom VTFET architecture from the top VTFET architecture 34B formed thereon. The top VTFET architecture is obtained by forming, in order, a sacrificial bottom source/drain layer 38A, a bottom spacer layer 22A, a patterned top sacrificial gate layer 24 having discrete portions bounded by vertical spacers 26', a top spacer layer 22B, and an optional sacrificial top source/drain layer 38B. The materials used to form the top VTFET architecture may or may not be the same as those used to form the bottom VTFET architecture. In some embodiments, the bottom and top sacrificial source/drain layers 38A, 38B consist essentially of borosilicate glass (BSG) in some exemplary embodiments wherein the top VTFET architecture 34B is employed to form a pFET device. As known in the art, BSG films can be deposited using a low pressure chemical vapor deposition (LPCVD) reactor using selected precursors as sources of $SiO_2$ and $B_2O_3$. In some embodiments, a top epitaxial source/drain region is formed later in the process after trench epitaxy without the use of a top sacrificial source/drain layer on VTFET architecture 34B.

The structure 50 shown in FIG. 7 includes pre-patterned sacrificial gate layers 24. In some embodiments, pre-patterned sacrificial source/drain regions are formed using techniques similar to those used for forming the pre-patterned sacrificial gate layers. Vertical spacers (not shown in FIG. 7) are formed on the patterned sacrificial source/drain regions to constrain feature dimensions when portions of the sacrificial source/drain material are replaced with doped semiconductor material. The sacrificial gate layers 24 in both VTFET architectures 34A, 34B may comprise the same materials. The gate layer spacers 26' and the electrically insulating spacer layer 36 may also comprise the same material to facilitate fabrication. The same materials may be employed to form the horizontal top and bottom spacers 22A, 22B of both VTFET architectures. The horizontal and vertical (gate layer) spacers allow selective removal of portions of the sacrificial gate material later in the fabrication process.

Figure 8:
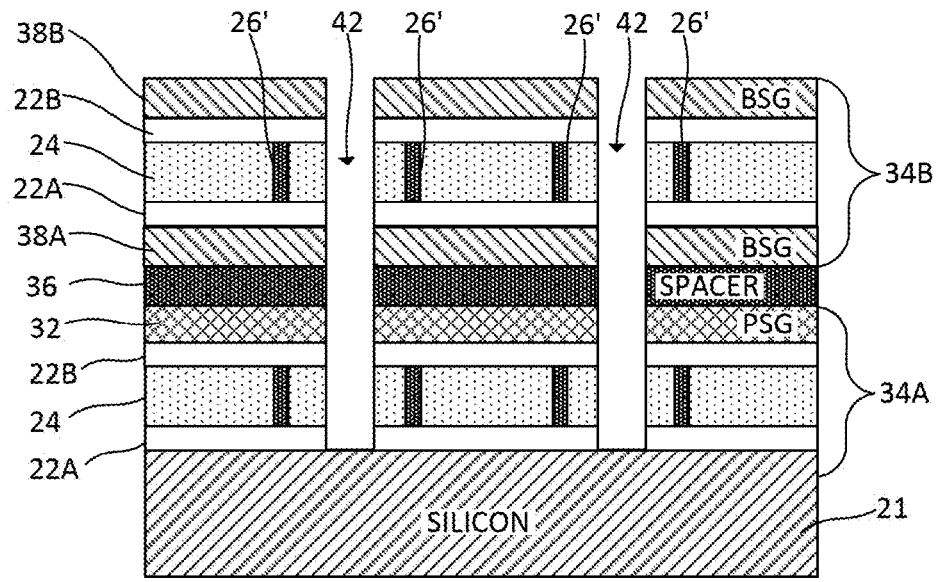
FIG. 8 is a schematic, cross-sectional view showing the structure of FIG. 7 following formation of vertical trenches therein.

Referring to FIG. 8, vertical trenches 42 are formed through the top and bottom VTFET architectures 34B, 34A down to the top surface of the substrate layer 21. The trenches are formed using one or more reactive ion etch (RIE) processes such that the trench sidewalls are substantially vertical. The trenches 42 extend within segments of the vertical spacers 26' that laterally partition the gate regions. Trench width as viewed in FIG. 8 may be five to fifteen nanometers (5-15 nm). Trench dimensions that subsequently determine channel width may be greater.

Figure 9:
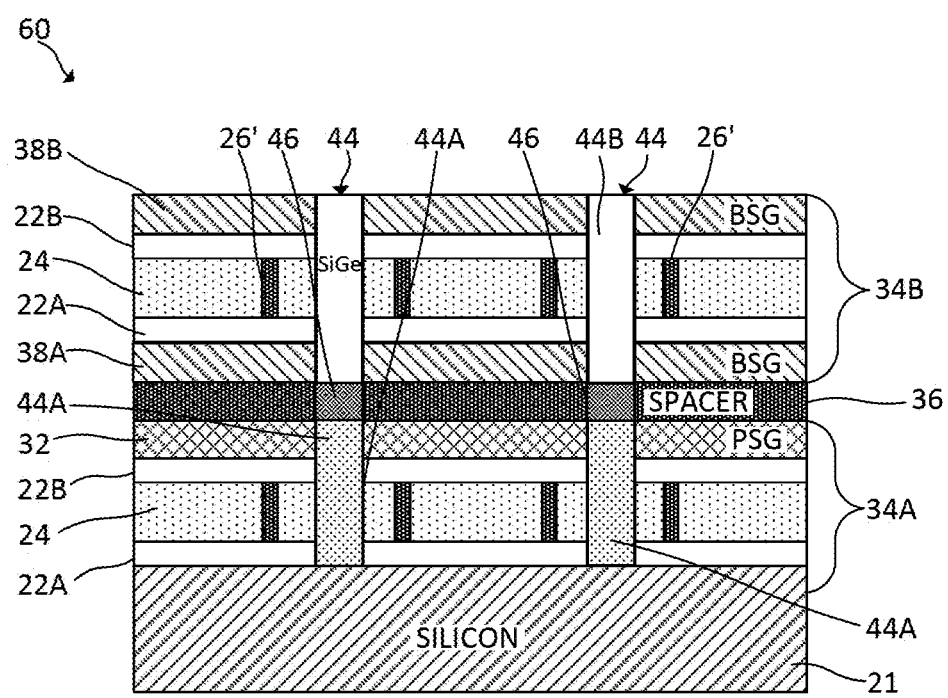
FIG. 9 is a schematic, cross-sectional view showing the structure of FIG. 8 following growth of epitaxial films within the vertical trenches.

Epitaxial films are grown on the exposed top surfaces of the substrate layer and fill the vertical trenches 42. The resulting fins 44 comprise channel regions of the VTFETs to be formed from the VTFET architectures 34A, 34B. A structure 60 as schematically illustrated in FIG. 9 may be obtained.

In an exemplary embodiment in which pFET devices are to be formed above nFET devices, the substrate layer 21 may consist essentially of silicon containing n-type dopants. Epitaxial growth of the semiconductor fins 44 includes growing silicon bottom regions 44A and silicon germanium top regions 44B within the trenches 42. The bottom regions 44A include channel regions that extend through the bottom sacrificial gate layer 24 while the top regions 44B have channel regions extending through the top sacrificial gate layer 24. The channel regions are optionally lightly doped. The top channel regions 44B may, for example, have the composition $Si_{1-x}Ge_x$ where x is, for example, between 0.2 and 0.6 It will be appreciated that the bottom and top fin regions 44A, 44B may alternatively consist essentially of a single semiconductor material, for example silicon. The methods described herein may, in some embodiments, be adapted for epitaxially growing fin regions comprising III-V semiconductor compounds.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of semiconductor materials. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). III-V semiconductor compounds can be grown using MOCVD in embodiments where such compounds are employed.

An electrically insulating material is ultimately formed between the top and bottom fin regions 44B, 44A. In a first exemplary embodiment, an epitaxial partition layer 46 within the trench comprises silicon germanium including a high percentage of germanium (for example $Si_{1-x}Ge_x$ where x is greater than 0.5). A partition layer 46 is epitaxially formed on the bottom region 44A of each fin 44. In a second exemplary embodiment, an epitaxial oxide layer is grown on the bottom regions 44A of the fins 44. If the partition layer 46 comprises silicon germanium, it is subsequently replaced by electrically insulating material following completion of the semiconductor fins 44. The germanium content of a silicon germanium partition layer should be sufficient to allow its selective removal with respect to the bottom and top regions of the semiconductor fin 44. Accordingly, if the top or bottom fin region comprises silicon germanium, the difference in germanium content between the partition layer and the bottom or top fin region should be large enough to permit selective etching of the partition layer. If an epitaxial oxide layer is formed between top and bottom fin regions, partition layer replacement is not necessary. The partition layer 46 adjoins the electrically insulating spacer layer 36. The structure 60 as schematically illustrated in FIG. 9 includes vertical fins 44 having bottom and top semiconductor regions 44A, 44B, the epitaxial partition layer 46 dividing these regions.

Exemplary epitaxial oxide materials that may be grown on an underlying semiconductor layer include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the crystalline oxide layer includes combinations of rare earth oxides (e.g., a material such as $ABO_3$, where 'A' and 'B' may be any rare earth metal (e.g., lanthanum scandium oxide ($LaScO_3$)). In yet another embodiment, the crystalline oxide layer may include aluminum oxide $Al_2O_3$ or aluminum oxide compounds (e.g., lanthanum aluminum $LaAlO_3$). In yet other embodiments, the crystalline oxide layer includes Perovskites (e.g. strontium titanate ($SrTiO_3$) or barium titanate ($BaTiO_3$)) which may be deposited by pulsed laser deposition (PLD). It is understood that the descriptions of crystalline oxide layers provided herein are for illustrative purposes, and that other crystalline oxide layers or layer combinations may be used in accordance with other embodiments.

Figure 10A:
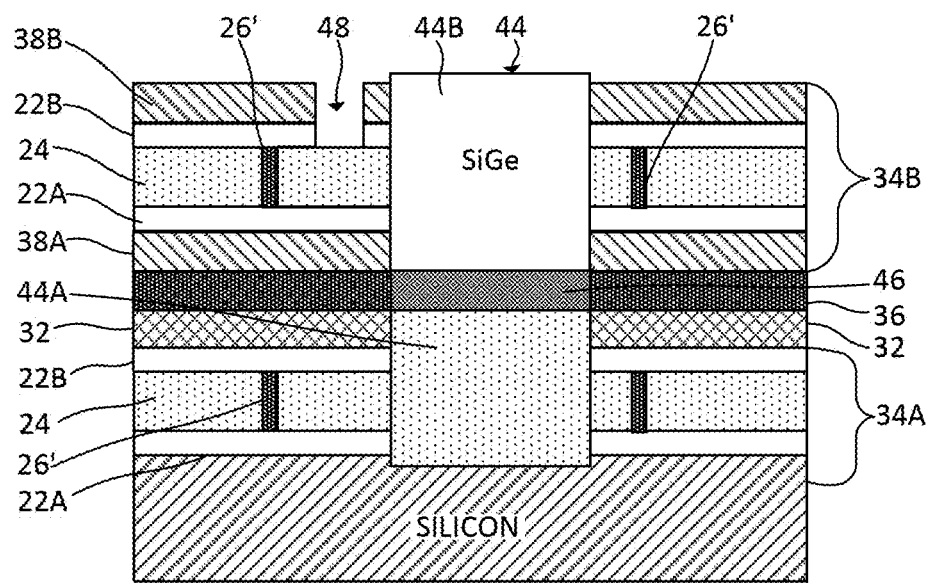
FIG. 10A is a schematic, cross-sectional view taken along line A-A of FIG. 10B showing the structure of FIG. 9 following etching a via down to a layer of the sacrificial gate material.
Figure 10B:
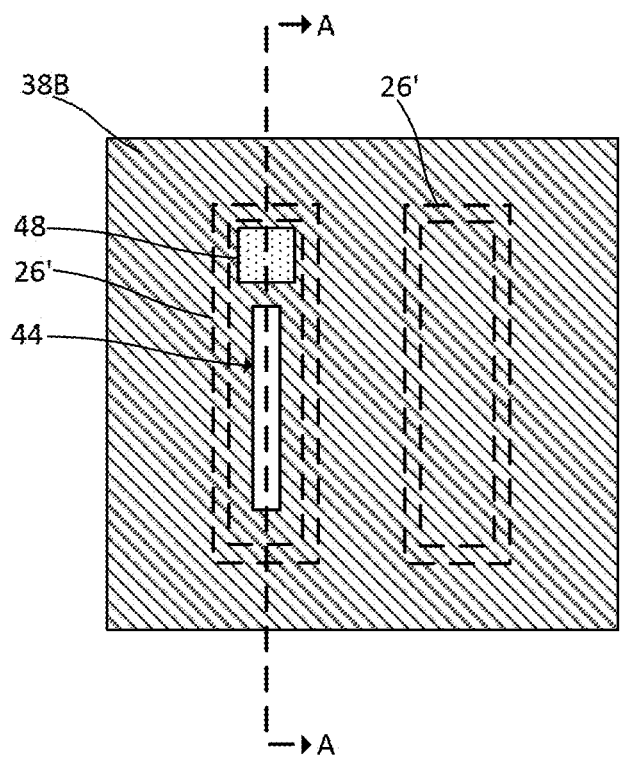
FIG. 10B is a top plan view thereof.
Figure 11A:
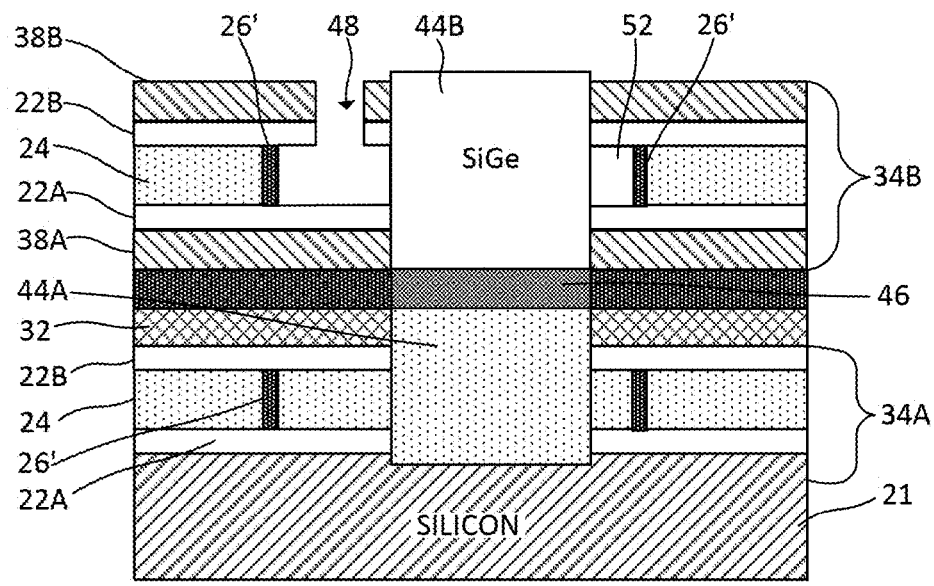
FIG. 11A is a schematic, cross-sectional view taken along line A-A of FIG. 11B showing the structure of FIG. 10A following removal of a portion of a layer of sacrificial gate material.
Figure 11B:
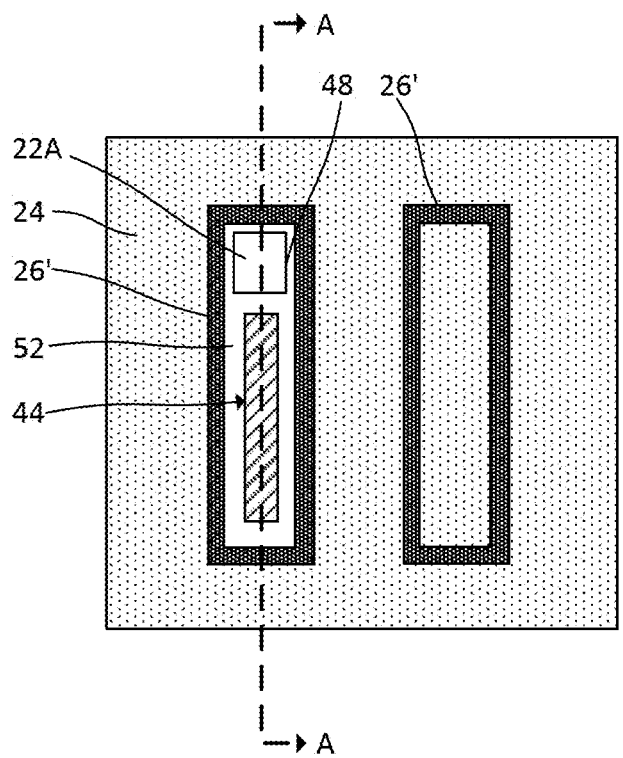
FIG. 11B is a partially sectional, top plan view thereof.

A replacement metal gate (RMG) process is employed to replace the pre-patterned sacrificial gate material with functional gate materials. Referring to FIGS. 10A and 10B, a via 48 is etched through the top sacrificial source/drain layer 38B and the top spacer 22B down to the sacrificial gate layer 24 of the top VTFET architecture 34B. Sacrificial gate material is removed by selective etching to obtain a structure 70 as schematically illustrated in FIGS. 11A and 11B. (Portions of the layers above the sacrificial gate layer 24 are omitted from FIG. 11B for illustrative purposes.) Buffered hydrofluoric acid is among the materials that can be used to etch silicon dioxide selective to spacer and channel materials in embodiments wherein the sacrificial gate material comprises silicon dioxide. The gate layer spacers 26' function as etch stops and prevent the removal of sacrificial gate material laterally beyond the etch stops. The bottom and top spacers 22A, 22B and the top fin region 44B also remain essentially intact following gate material removal. The resulting structure 70 includes an open space 52 bounded by spacer segments and adjoining the channel region of one of the top fin regions 44B.

Figure 12A:
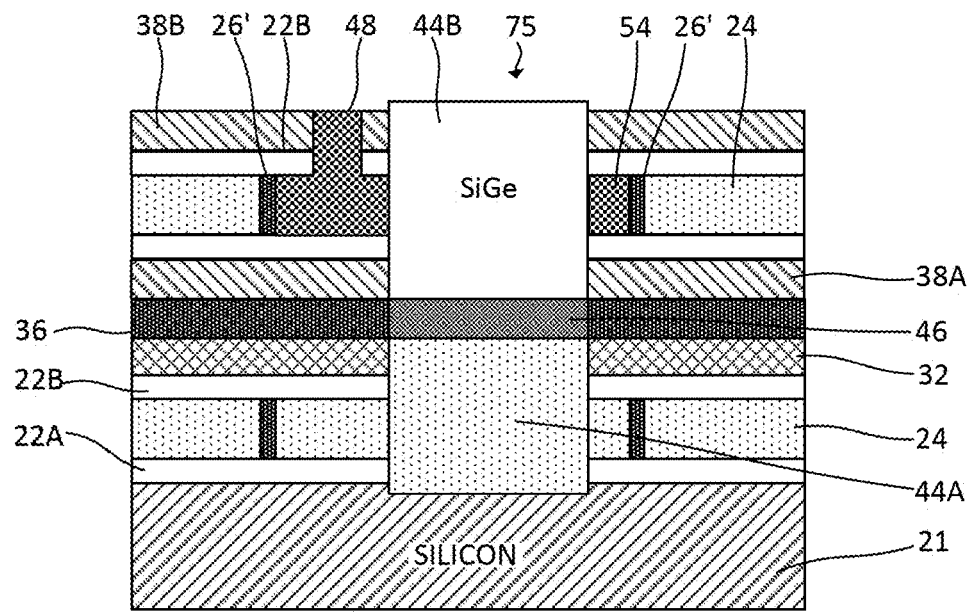
FIG. 12A is a schematic, cross-sectional view taken along line A-A of FIG. 12B showing the structure of FIG. 11A following deposition of gate materials.
Figure 12B:
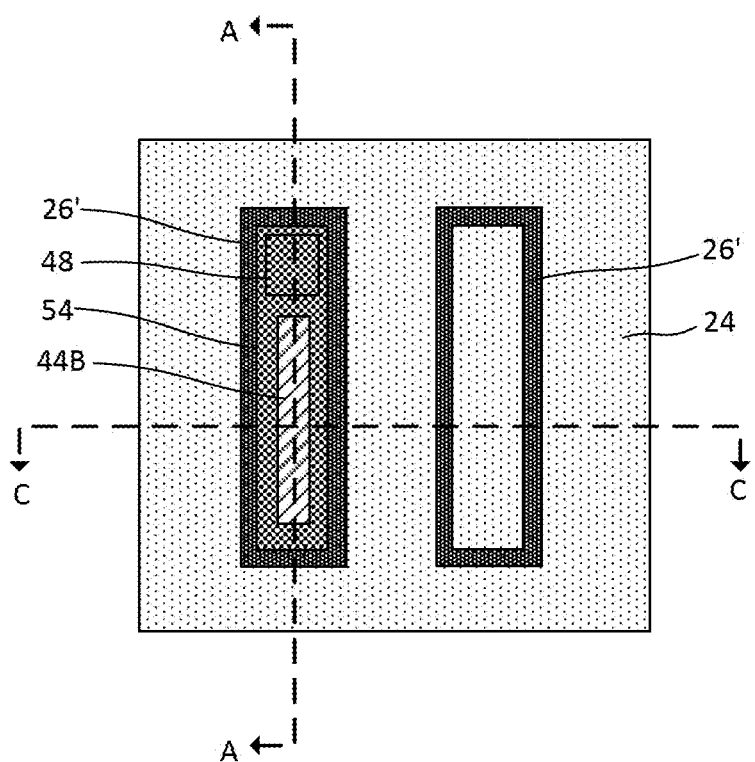
FIG. 12B is a partially sectional, top plan view thereof.
Figure 12C:
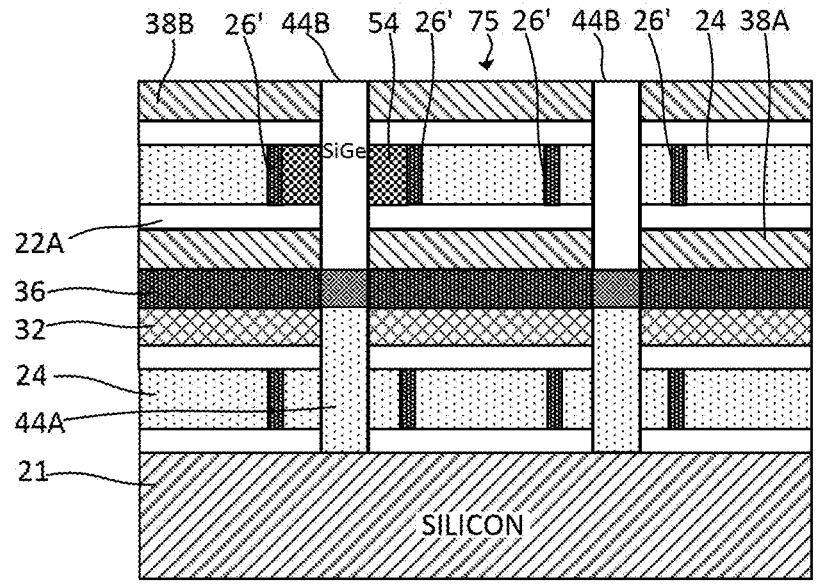
FIG. 12C a further schematic, cross-sectional view taken along line C-C of FIG. 12B.
Figure 12C:
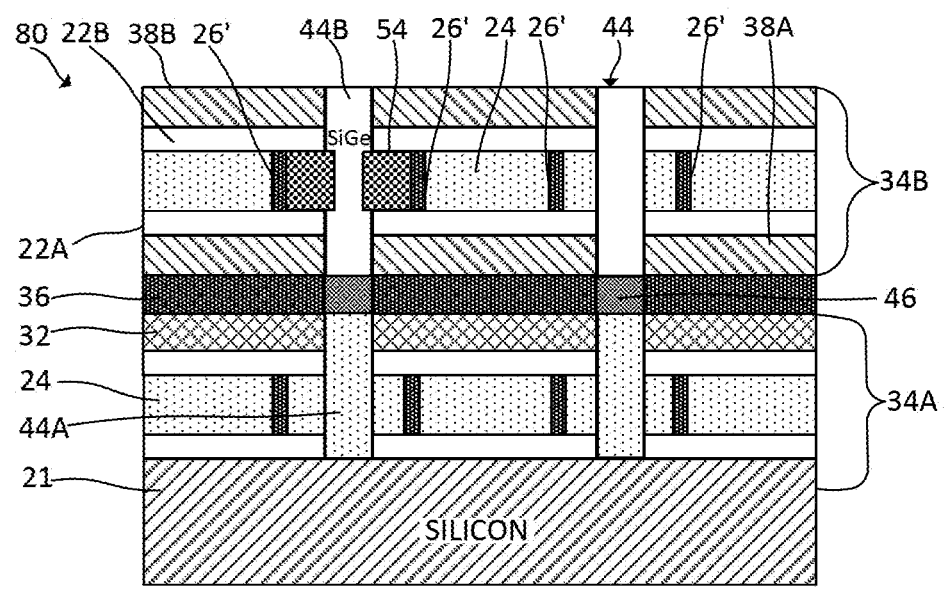

A gate dielectric layer and gate metal are deposited sequentially to form a gate stack 54 for one of the top VTFET architectures, as schematically illustrated in FIGS. 12A-12C. A gate-all-around (GAA) structure is obtained. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

A work function metal (WFM) layer is disposed over the gate dielectric layer. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering. The WFM layer may form all or part of the gate electrode for the VTFET device once completed. Gate electrode materials such as titanium nitride (TiN) and/or tungsten (W) may be deposited in some embodiments. Gate length of the structure 75 is determined by the distance between the bottom and top spacers 22A, 22B while the gate layer spacer segments determine the lateral dimensions of the gate stack.

An alternative structure 80 following replacement of a portion of the sacrificial gate layer 24 is shown in FIG. 12CC. In this embodiment, the vertical trenches (42 in FIG. 8) have dimensions larger than the dimensions of the channel regions to be formed later in the process. The semiconductor fins 44 formed within the vertical trenches will accordingly have channel regions that exceed targeted dimensions. Following removal of sacrificial gate material adjoining the top fin region 44B of one or more of the semiconductor fins 44, as shown in FIGS. 11A and 11B, a timed etch is employed to form recesses in the channel regions of the fins 44. Silicon germanium top regions 44B can, for example, be recessed using an etching process that is selective to the adjoining dielectric spacers. Hydrogen chloride gas is employed in some embodiments where a silicon germanium portion of a fin is to be etched. Alternatively, a timed wet etch process containing ammonia and hydroperoxide can be used to etch SiGe selective to other materials. Following fin recessing, gate material is deposited within the space 52 to form a gate stack 54 adjoining the recessed (channel) portion of the fin 44 to obtain a stacked VTFET structure 80 as shown in FIG. 12CC. It will be appreciated that the silicon bottom regions of the fins may similarly be recessed in some embodiments using a timed etch selective to silicon. A timed wet etch using a solution containing hydrofluoric acid may, for example, be employed to recess silicon region(s) of the fins following removal of the adjoining sacrificial gate material. The fin recessing process may alternatively employ a TMAH (tetramethyl ammonium hydroxide) etch.

Figure 13A:
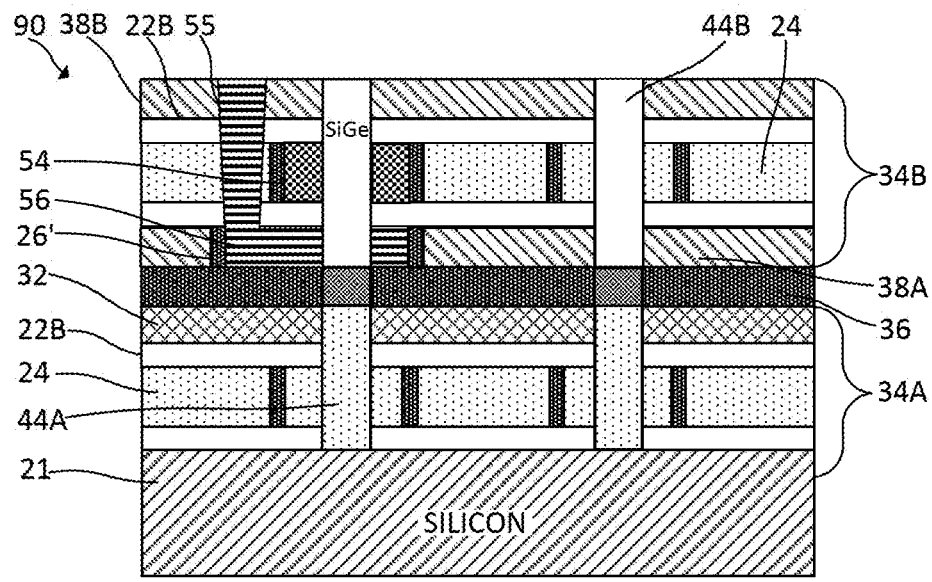
FIG. 13A is a schematic, cross-sectional view taken along line A-A of FIG. 13B of the structure shown in FIGS. 12A-12C following a source/drain replacement process.
Figure 13B:
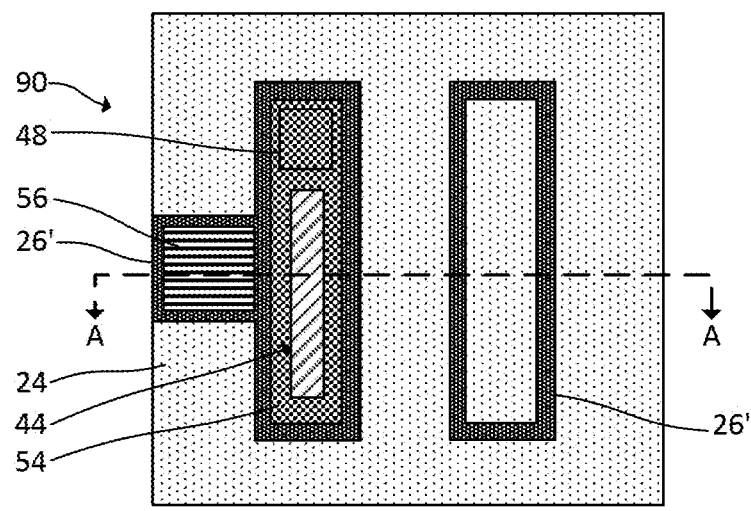
FIG. 13B is a partially sectional, top plan view thereof.

An exemplary structure 90 following source/drain replacement in one of the stacked VTFET structures is shown in FIGS. 13A and 13B. As discussed above, the sacrificial source/drain regions are pre-patterned in some embodiments and vertical source/drain spacers can be formed using steps similar to those described above with respect to the sacrificial gate regions 24. The spacers 26' formed in the sacrificial source/drain regions extend vertically between horizontally extending dielectric layers. As illustrated in FIG. 13A, vertically extending spacers 26' are formed in the bottom sacrificial source/drain region 38A of the top VTFET architecture 34B. The source/drain spacers 26' extend between the electrically insulating spacer 36 that separates the top and bottom VTFET architectures and the bottom spacer 22A within the top VTFET architecture 34B. The vertically extending spacers 26' in both gate and source/ drain regions can be formed of the same dielectric material in some embodiments and function as etch stops during subsequent removal of sacrificial materials. The spacers 26' further constrain the dimensions of the gate stacks and source/drain regions that form elements of the stacked VTFETs once completed.

Referring again to FIG. 13A, one of the semiconductor fins 44 extends between segments of the spacers 26' in two layers of the top VTFET architecture 34B, namely the layer in which the gate stack is formed and the layer in which a doped source/drain layer is formed. A via 55 is formed down to the bottom sacrificial source/drain layer 38A thereof. The sacrificial source/drain material is removed, leaving a space (not shown) between the horizontal spacer 36 and the bottom spacer through which the fin 44 extends. A buffered hydrogen fluoride (HF) solution can be employed to selectively remove borosilicate glass (BSG) from the space in embodiments wherein BSG is employed as sacrificial source/drain material. The sacrificial source/drain material outside the source/drain spacer 26' remains intact.

A doped bottom source/drain region 56 is formed within the space from which the sacrificial source/drain material was removed. Epitaxial growth of the source/drain region is constrained laterally by the vertical spacer segments and vertically by the horizontally oriented dielectric layers above and below. The epitaxially grown source/drain region 56 can be doped in situ. Dopants may include, for example, a p-type dopant selected from a group of boron (B), gallium (Ga), indium (In), and thallium (Tl) at various concentrations. The source/drain region 56 can include, but is not necessarily limited to, crystalline silicon (Si), silicon germanium (SiGe), or other semiconductor material. Replacement epitaxy for sacrificial source/drain materials in the bottom VTFET architecture 34A would, in one or more embodiments, include n-type dopant(s), for example phosphorus (P), arsenic (As) and/or antimony (Sb). An array of pFET devices may accordingly be formed over an array of nFET devices in some embodiments. The top epitaxial source/drain region (not shown) may be formed by replacing part or all of the sacrificial layer 38B, possibly after patterning the sacrificial layer and spacer formation. As indicated above, the top sacrificial layer 38B is optional as a doped source/drain region can be epitaxially grown on the exposed top portion of the semiconductor fin 44.

Source/drain regions may alternatively be formed using dopant-containing silicate layers (for example, the PSG and BSG layers 32, 38A, 38B described above) for doping source/drain regions. In such embodiments, thermal diffusion of phosphorus and boron ions from the silicate layers into adjoining portions of the bottom and top portions of the semiconductor fin is conducted. Growth of epitaxial source/drain regions may be unnecessary in such embodiments. In other embodiments, plasma doping is performed to form source/drain regions after sacrificial source/drain materials have been removed.

The pre-patterning techniques as described herein with respect to sacrificial gate and/or source/drain layers are applicable to the fabrication of single (unstacked) VTFET devices as well as stacked VTFET devices or portions of stacked VTFET devices. For example, a vertical transport field-effect transistor architecture may include a bottom source/drain region (either sacrificial or an operable, doped semiconductor region), a sacrificial gate layer above the bottom source/drain region, a bottom dielectric spacer between the bottom source/drain region and the sacrificial gate layer, a top dielectric spacer over the sacrificial gate layer, and a plurality of dielectric gate spacer elements extending vertically within the sacrificial gate layer and between the bottom and top dielectric spacers. The gate spacer elements may be formed as described above with respect to FIGS. 2, 3 and 4A-B. A sacrificial top source/drain region would be optional. A vertical trench is formed through the vertical transport field-effect transistor architecture and a semiconductor fin is epitaxially grown within the vertical trench. The semiconductor fin includes a channel region extending through the sacrificial gate layer. A portion of the sacrificial gate layer is replaced with gate dielectric material and metal gate material bounded by the gate spacer elements. As discussed above with respect to FIGS. 10A and 10B, a via is formed in the VTFET architecture down to the sacrificial gate layer. A portion of the sacrificial gate layer within the gate spacer elements is removed to form an open space bounded by the gate spacer elements as described above with respect to FIGS. 11A and 11B. The gate dielectric material and the metal gate material are deposited within the open space.

Figure 14:
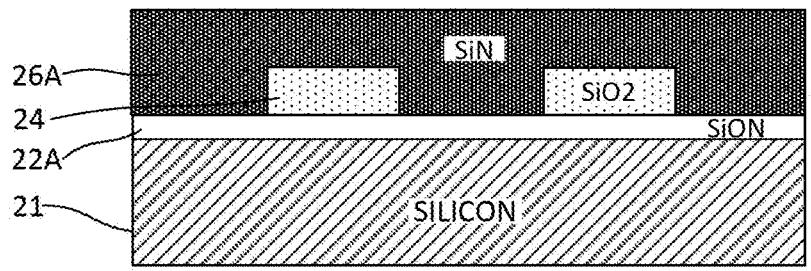
FIG. 14 is a schematic, cross-sectional view showing one stage of an alternative process of forming a sacrificial gate layer.
Figure 15:
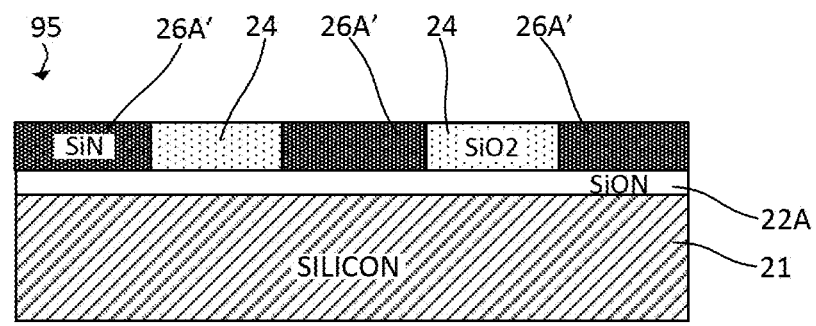
FIG. 15 is a schematic, cross-sectional view showing a subsequent stage of the alternative process.

Spacer elements can be formed in one or more sacrificial regions using alternative techniques. In one exemplary technique, the bottom sacrificial gate layer 24 is patterned as described above with respect to FIG. 2. A planarizing layer 26A of dielectric material later used to form spacer elements is deposited on the structure. A silicon nitride layer may, for example, be deposited in embodiments wherein the sacrificial gate layer comprises silicon dioxide. The planarizing layer 26A fills the trenches 28 between the sacrificial gate portions and encapsulates the sacrificial gate portions as schematically illustrated in FIG. 14. The planarizing layer 26A is then polished down to the top surfaces of the sacrificial gate portions to form a structure 95 as schematically illustrated in FIG. 15. The structure 95 includes sacrificial gate portions that are bounded by spacer elements 26A'. As there are no gaps between spacer elements 26A' and sacrificial gate portions, filling of gaps as discussed above with respect to FIG. 5 is unnecessary.

An etch/polish stop (not shown) may be deposited on the sacrificial gate layer 24 prior to deposition of the planarizing layer 26A and sacrificial gate layer patterning. The stop layer, if employed, would also be patterned. A high-k dielectric material may, for example, form a stop layer on the sacrificial gate portions. The stop layer would be removed following the polishing of the planarizing layer. Trenches to be filled with channel material are formed through the sacrificial gate portions once a VTFET architecture has been completed. The same processes described above may be employed to complete the stacked or unstacked architecture. The sacrificial gate portions through which the channels are formed are subsequently replaced by gate dielectric and gate metal layers. It will be appreciated that the sacrificial layers of VTFET architectures can, in some embodiments, be processed using one or both techniques described herein for forming spacer elements.

The electronic devices made from the stacked VTFET structure 90 and/or an unstacked VTFET structure may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of fabricating a stacked vertical transport field-effect transistor structure includes forming a bottom vertical transport field-effect transistor architecture including a first sacrificial gate layer 24 and a plurality of dielectric gate spacer elements 26' extending vertically within the first sacrificial gate layer, forming an electrically insulating spacer layer over the bottom vertical transport field-effect transistor architecture, and forming a top vertical transport field-effect transistor architecture over the electrically insulating spacer layer. The top vertical transport field-effect transistor architecture including a second sacrificial gate layer 24 and a plurality of dielectric gate spacer elements 26' extending vertically within the second sacrificial gate layer. A vertical trench 42 is formed through the top vertical transport field-effect transistor architecture, the electrically insulating spacer layer 36 and the bottom vertical transport field-effect transistor architecture down to a semiconductor substrate layer 21, such as shown in FIG. 8. A bottom fin portion 44A of a semiconductor fin 44 is epitaxially grown on the semiconductor substrate layer 21 and within the vertical trench 42. The bottom fin portion extends through the bottom vertical transport field-effect transistor architecture and within the gate spacer elements 26' in the first sacrificial gate layer 24. A partition layer 46, for example a semiconductor layer or an epitaxial oxide layer, is epitaxially grown within the vertical trench and over the bottom fin portion 44A. A top fin portion 44B is epitaxially grown on the partition layer 46 and within the vertical trench 42. The top fin portion extends through the top vertical transport field-effect transistor architecture and within the gate spacer elements 26' in the second sacrificial gate layer. The method may further include selectively removing a portion of the at least one of the first and second sacrificial gate layers 24 to form a horizontal space 52 bounded by the gate spacer elements and depositing gate dielectric material and the metal gate material within the horizontal space. FIGS. 12A-12C illustrate an exemplary structure following deposition of a gate stack 54. In some embodiments, the bottom and top portions of the fin 44 are grown using different precursors and will have different compositions (for example, silicon and silicon germanium).

Further given the above discussion, a stacked, vertical transport field-effect transistor structure includes a bottom vertical transport field-effect transistor structure 34A including a first gate layer, a bottom source/drain layer including a doped semiconductor substrate layer 21, a top source/drain layer, a bottom horizontal spacer 22A between the doped semiconductor substrate layer and the first gate layer, and a top horizontal spacer 22B between the first gate layer and the top source/drain layer. Dielectric gate spacer elements within the first gate layer extend between the bottom horizontal spacer and the top horizontal spacer of the bottom vertical transport field-effect transistor structure. The stacked VTFET structure further includes a top vertical transport field-effect transistor structure 34B above the bottom vertical transport field-effect transistor structure 34A and including a second gate layer 24, a bottom source/drain layer, a top source/drain layer, a bottom horizontal spacer 22A between the bottom source/drain layer and the second gate layer, and a top horizontal spacer 22B between the second gate layer and the top source/drain layer. Dielectric gate spacer elements within the second gate layer extend between the bottom horizontal spacer and the top horizontal spacer of the bottom vertical transport field-effect transistor structure. A horizontal, electrically insulating spacer layer 36 is between the bottom vertical transport field-effect transistor structure and the top vertical transport field-effect transistor structure. A vertical trench extends through the top vertical transport field-effect transistor structure 34B, the electrically insulating spacer 36, and the bottom vertical transport field-effect transistor structure 34A down to the doped semiconductor substrate layer 21. A semiconductor fin 44 adjoins the doped semiconductor substrate layer and extends through the vertical trench. A top portion 44B of the fin extends within the top vertical transport field-effect transistor structure 34B and a bottom portion 44A thereof extends within the bottom vertical transport field-effect transistor structure 34A. An electrically insulating layer electrically isolates the top fin portion and the bottom fin portion of the epitaxial semiconductor fin. At least one of the first and second gate layers includes gate dielectric material and metal gate material 54. The bottom and top fin portions comprise different semiconductor materials in some embodiments, for example silicon and silicon germanium. In other embodiments, the bottom and top fin portions have the same semiconductor composition.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VTFETs therein.

An integrated circuit in accordance with aspects of the present disclosure can be employed in essentially any application and/or electronic system where the use of VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:
1. A method of fabricating a stacked vertical transport field-effect transistor structure, comprising:
forming a bottom vertical transport field-effect transistor architecture including a first sacrificial gate layer and a plurality of dielectric gate spacer elements extending vertically within the first sacrificial gate layer;
forming an electrically insulating spacer layer over the bottom vertical transport field-effect transistor architecture;
forming a top vertical transport field-effect transistor architecture over the electrically insulating spacer layer, the top vertical transport field-effect transistor architecture including a second sacrificial gate layer and a plurality of dielectric gate spacer elements extending vertically within the second sacrificial gate layer;
forming a vertical trench through the top vertical transport field-effect transistor architecture, the electrically insulating spacer layer and the bottom vertical transport field-effect transistor architecture down to a semiconductor substrate layer;
epitaxially growing a bottom fin portion of a semiconductor fin on the semiconductor substrate layer and within the vertical trench, the bottom fin portion extending through the bottom vertical transport field-effect transistor architecture and within the dielectric gate spacer elements in the first sacrificial gate layer;
epitaxially growing a partition layer within the vertical trench and over the bottom fin portion; and
epitaxially growing a top fin portion of the semiconductor fin on the partition layer and within the vertical trench, the top fin portion extending through the top vertical transport field-effect transistor architecture and within the dielectric gate spacer elements in the second sacrificial gate layer.

2. The method of claim 1, further including:
replacing a portion of at least one of the first and second sacrificial gate layers with gate dielectric material and metal gate material bounded by the dielectric gate spacer elements.

3. The method of claim 2, further including:
selectively removing the portion of the at least one of the first and second sacrificial gate layers to form a horizontal space bounded by the dielectric gate spacer elements; and
depositing the gate dielectric material and the metal gate material within the horizontal space.

4. The method of claim 3, further including forming a recess within the semiconductor fin adjoining the horizontal space.

5. The method of claim 3, wherein forming the bottom vertical transport field-effect transistor architecture further includes:
forming a layer of sacrificial gate material;
patterning the layer of sacrificial gate material; and
forming the dielectric gate spacer elements on sidewalls of the patterned layer of sacrificial gate material.

6. The method of claim 3, wherein:
epitaxially growing the bottom fin portion further includes growing a first semiconductor material on the semiconductor substrate layer; and
epitaxially growing the top fin portion further includes growing a second semiconductor material different from the first semiconductor material.

7. The method of claim 3, further including forming an electrically insulating layer within the vertical trench by epitaxially growing the partition layer as a semiconductor layer and replacing the partition layer with an electrical insulator.

8. The method of claim 3, wherein:
the bottom vertical transport field-effect transistor architecture includes a first sacrificial source/drain layer above the first sacrificial gate layer;
the top vertical transport field-effect transistor architecture includes a bottom sacrificial source/drain layer, the second sacrificial gate layer being above the bottom sacrificial source/drain layer;
the first sacrificial source/drain layer comprises a first silicate compound including a first dopant type; and
the bottom sacrificial source/drain layer within the top vertical transport field-effect transistor includes a second silicate compound including a second dopant type opposite to the first dopant type.

9. The method of claim 3, wherein forming the top vertical transport field-effect transistor architecture further includes:
forming a bottom sacrificial source/drain layer prior to forming the second sacrificial gate layer;
patterning the bottom sacrificial source/drain layer; and
forming dielectric source/drain sidewall spacer elements on the patterned bottom sacrificial source/drain layer.

10. The method of claim 9, further including replacing a portion of the sacrificial bottom source/drain layer with a doped semiconductor source/drain region bounded by the dielectric source/drain sidewall spacer elements.

11. The method of claim 1, wherein forming the bottom vertical transport field-effect transistor architecture includes:
forming a bottom spacer layer over the semiconductor substrate layer;
depositing a layer of sacrificial gate material over the bottom spacer layer;
patterning the layer of sacrificial gate material to form a portion of the first sacrificial gate layer;
forming the plurality of dielectric gate spacer elements on sidewalls of the patterned sacrificial gate material;
forming a top spacer layer over the first sacrificial gate layer; and
forming a sacrificial source/drain region over the top spacer layer.

12. The method of claim 1, wherein the partition layer comprises an epitaxial oxide layer.

13. A method of fabricating a vertical transport field-effect transistor structure, comprising:
forming a vertical transport field-effect transistor architecture including a bottom source/drain region, a sacrificial gate layer above the bottom source/drain region, a bottom dielectric spacer between the bottom source/drain region and the sacrificial gate layer, a top dielectric spacer over the sacrificial gate layer, and a plurality of dielectric gate spacer elements extending vertically within the sacrificial gate layer and between the bottom and top dielectric spacers;
forming a vertical trench through the vertical transport field-effect transistor architecture;
epitaxially growing a semiconductor fin within the vertical trench, the semiconductor fin including a channel region extending through the sacrificial gate layer; and
replacing a portion of the sacrificial gate layer with gate dielectric material and metal gate material bounded by the dielectric gate spacer elements.

14. The method of claim 13, wherein replacing the portion of the sacrificial gate layer with gate dielectric material and metal gate material includes:

forming a via down to the sacrificial gate layer;

removing a portion of the sacrificial gate layer within the dielectric gate spacer elements to form an open space bounded by the dielectric gate spacer elements; and depositing the gate dielectric material and the metal gate material within the open space.

15. The method of claim 13, wherein forming the vertical transport field-effect transistor architecture includes:

forming the sacrificial gate layer over the bottom dielectric spacer;

patterning the sacrificial gate layer to form recesses within the sacrificial gate layer extending down to the bottom dielectric spacer;

depositing a planarizing layer on the patterned sacrificial gate layer such that portions of the planarizing layer fill the recesses within the sacrificial gate layer and form the dielectric gate spacer elements; and forming the top dielectric spacer over the sacrificial gate layer and the dielectric gate spacer elements.

16. A stacked, vertical transport field-effect transistor structure, comprising:

a bottom vertical transport field-effect transistor structure including a first gate layer, a bottom source/drain layer including a doped semiconductor substrate layer, a top source/drain layer, a bottom horizontal spacer between the doped semiconductor substrate layer and the first gate layer, a top horizontal spacer between the first gate layer and the top source/drain layer, and a plurality of dielectric gate spacer elements within the first gate layer and extending between the bottom horizontal spacer and the top horizontal spacer of the bottom vertical transport field-effect transistor structure;

a top vertical transport field-effect transistor structure above the bottom vertical transport field-effect transistor structure and including a second gate layer, a bottom source/drain layer, a top source/drain layer, a bottom horizontal spacer between the bottom source/drain layer and the second gate layer, a top horizontal spacer between the second gate layer and the top source/drain layer, and a plurality of dielectric gate spacer elements within the second gate layer and extending between the bottom horizontal spacer and the top horizontal spacer of the top vertical transport field-effect transistor structure;

a horizontal, electrically insulating spacer layer between the bottom vertical transport field-effect transistor structure and the top vertical transport field-effect transistor structure;

a vertical trench extending through the top vertical transport field-effect transistor structure, the electrically insulating spacer layer, and the bottom vertical transport field-effect transistor structure down to the doped semiconductor substrate layer;

a semiconductor fin on the doped semiconductor substrate layer and within the vertical trench, the semiconductor fin including a top fin portion extending within the top vertical transport field-effect transistor structure and a bottom fin portion extending within the bottom vertical transport field-effect transistor structure;

an electrically insulating partition layer within the vertical trench and electrically isolating the top fin portion and the bottom fin portion;

at least one of the first and second gate layers comprising gate dielectric material and metal gate material bounded by a first set of the dielectric gate spacer elements.

17. The stacked, vertical transport field-effect transistor structure of claim 16, wherein the at least one of the first and second gate layers further includes sacrificial gate material bounded by a second set of the dielectric gate spacer elements.

18. The stacked, vertical transport field-effect transistor structure of claim 16, wherein the bottom fin portion comprises a first semiconductor material and the top fin portion comprises a second semiconductor material different from the first semiconductor material.

19. The stacked, vertical transport field-effect transistor structure of claim 16, wherein at least one of the top and bottom source/drain layers includes a discrete doped semiconductor region bounded by a vertically extending dielectric spacer within the at least one of the top and bottom source/drain layers.

20. The stacked, vertical transport field-effect transistor structure of claim 16, wherein at least one of the top fin portion and the bottom fin portion includes a recessed portion configured as a channel region.

* * * * *